US 8,547,705 B2

(12) United States Patent  (10) Patent No.: US 8,547,705 B2
Inaba et al.  (45) Date of Patent: Oct. 1, 2013

(54) SEMICONDUCTOR DEVICE HAVING POWER SUPPLY-SIDE AND GROUND-SIDE METAL REINFORCING MEMBERS INSULATED FROM EACH OTHER

(75) Inventors: Kenichi Inaba, Tokyo (JP); Minoru Yoshikawa, Tokyo (JP)

(73) Assignee: NEC Corporation, Tokyo (JP)

(*) Notice: Subject to any disclaimer, the term of this patent is extended or adjusted under 35 U.S.C. 154(b) by 59 days.

(21) Appl. No.: 13/388,285

(22) PCT Filed: Aug. 20, 2010

(86) PCT No.: PCT/JP2010/064075
§ 371 (c)(1),
(2), (4) Date: Jan. 31, 2012

(87) PCT Pub. No.: WO2011/021690
PCT Pub. Date: Feb. 24, 2011

(65) Prior Publication Data
US 2012/0126432 A1  May 24, 2012

(30) Foreign Application Priority Data
Aug. 20, 2009 (JP) ............................... P2009-190962

(51) Int. Cl.
*H05K 7/00* (2006.01)
(52) U.S. Cl.
USPC ....... 361/760; 257/782; 257/734; 257/E23.01
(58) Field of Classification Search
USPC .................... 361/760; 257/782, 734, E23.01
See application file for complete search history.

(56) References Cited

U.S. PATENT DOCUMENTS

| 5,699,610 A | 12/1997 | Shimada et al. |
| 5,814,535 A | 9/1998 | Shimada et al. |
| 5,838,064 A | 11/1998 | Shimada et al. |
| 6,087,597 A | 7/2000 | Shimada et al. |
| 6,518,666 B1 | 2/2003 | Ikeda |

FOREIGN PATENT DOCUMENTS

| JP | 6-097307 A | 4/1994 |
| JP | 8-088302 A | 4/1996 |
| JP | 2001-156246 A | 6/2001 |
| JP | 2008-124248 A | 5/2008 |
| JP | 2008-235852 A | 10/2008 |
| JP | 2008-244394 A | 10/2008 |
| JP | 2009-021366 A | 1/2009 |

OTHER PUBLICATIONS

International Search Report in PCT/JP2010/064075 dated Sep. 21, 2010 (English Translation Thereof).

*Primary Examiner* — Timothy Thompson
*Assistant Examiner* — Andargie M Aychillhum
(74) *Attorney, Agent, or Firm* — McGinn IP Law Group, PLLC

(57) ABSTRACT

Provided is a semiconductor device which includes a wiring substrate; a semiconductor chip fixedly attached to a first surface of the wiring substrate; a power supply pad that is provided on a second surface opposite to the first surface of the wiring substrate, and supplies electric power to the wiring substrate; a ground pad that is provided on the second surface of the wiring substrate and grounds the wiring substrate; a power supply-side reinforcing member that is connected to the power supply pad and made of metal; a ground-side reinforcing member that is connected to the ground pad and made of metal; and an insulating part that insulates the power supply-side reinforcing member and the ground-side reinforcing member from each other.

7 Claims, 13 Drawing Sheets

SEMICONDUCTOR DEVICE HAVING POWER SUPPLY-SIDE AND GROUND-SIDE METAL REINFORCING MEMBERS INSULATED FROM EACH OTHER

TECHNICAL FIELD

The present invention relates to a semiconductor device having a wiring substrate on which a semiconductor chip is attached.

Priority is claimed on Japanese Patent Application No. 2009-190962, filed Aug. 20, 2009, the contents of which are incorporated herein by reference.

BACKGROUND ART

Accompanied with downsizing of apparatuses in which a semiconductor device is built, downsizing and thinning of a wiring substrate, which is included in the semiconductor device and generally made of resin, has been requested. However, thinning of the wiring substrate reduces the rigidity thereof.

In such a case, an LSI (semiconductor chip) is connected to a wiring substrate having a larger coefficient of linear expansion compared with the LSI, by means of reflow soldering using solder balls, then a thermal stress caused by the difference in the coefficient of linear expansion between the LSI and the wiring substrate affects the cooling process after the reflow, so that the LSI tends to warp and have a protruded shape. As a result, insufficient connection at a solder-connection part may occur. In addition, when a heat sink is provided on the upper surface of the LSI, heat radiation performance may be reduced due to a warp of the LSI.

In order to solve the above problem, Patent Document 1 discloses a structure in which an LSI is connected to a main surface (corresponding to the first surface of the present invention) of a wiring substrate by means of flip-chip connection, and a plate material (as a reinforcing member), which has a coefficient of linear expansion smaller than that of the wiring substrate and close to that of the LSI, and is made of alumina ceramics or zirconia, is adhered to a back surface (corresponding to the second surface of the present invention) of the wiring substrate, which is opposite to the main surface.

According to the above structure, since the wiring substrate is interposed between the plate member and the LSI which has a smaller coefficient of linear expansion than that of the substrate, a force which causes a warp of the wiring substrate is reduced so that the warp of the wiring substrate can be almost completely suppressed.

In a semiconductor device disclosed in Patent Document 2, a support plate is adhered to a first main surface (corresponding to the second surface of the present invention) of an organic wiring substrate (corresponding to the wiring substrate of the present invention), and a semiconductor chip is connected to a second main surface (corresponding to the first surface of the present invention) of the organic wiring substrate, which is opposite to the first main surface.

As the support plate, a metal plate (as a reinforcing member) made of copper or tungsten copper is used, which has a coefficient of linear expansion close to that of the semiconductor chip. On a surface of the support plate opposite to the surface to which the organic wiring substrate is adhered, a thin layer part and a rib frame structure are provided. The rib frame structure is a beam frame structure which crosses the thin layer part in the longitudinal and transverse directions no as to support the thin layer part. The semiconductor device having such a structure improves heat radiation performance and reduces the degree of a warp by increasing the surface area of the support plate by using the rib frame structure.

In a semiconductor module (i.e., semiconductor device) disclosed in Patent Document 3, a metal circuit plate (as a semiconductor chip) is formed on one surface (corresponding to the first surface of the present invention) of a ceramic substrate (corresponding to the wiring substrate of the present invention), and a heat radiating metal plate thicker than the metal circuit plate is formed on the other surface (corresponding to the second surface of the present invention) of the ceramic substrate. The heat radiating metal plate has slits in the thickness direction.

According to such a structure of the semiconductor module, it is possible to improve the heat radiation efficiency and durability.

PRIOR ART DOCUMENT

Patent Document

Patent Document 1: Japanese Unexamined Patent Application, First Publication No. 2001-156246.
Patent Document 2: Japanese Unexamined Patent Application, First Publication No. 2008-124248.
Patent Document 3: Japanese Unexamined Patent Application, First Publication No. 2008-235852.

DISCLOSURE OF INVENTION

Problem to be Solved by the Invention

However, in each of the semiconductor devices shown in Patent Documents 1 to 3, in order to downsizing the whole device while providing a power supply pad and a ground pad for supplying power to the semiconductor device, a semiconductor chip is attached to a first surface of a wiring substrate, and the power supply pad and the ground pad are provided on a second surface opposite to the first surface.

Additionally, in order to reduce the degree of a warp in the semiconductor device, attachment of a reinforcing member having a size substantially identical to the first surface is requested. If such a reinforcing member is attached to the first surface, it interferes with the semiconductor chip, and thus attachment to the second surface has been examined.

When providing the power supply pad and the ground pad in each of the semiconductor devices shown in Patent Documents 1 to 3, if the reinforcing member is made of metal, the degree of a warp in the semiconductor device can be reduced, and heat radiation performance can be improved. However, this case may occur a problem in that the power supply pad and the ground pad are each connected to the reinforcing member, and form a short circuit.

If the reinforcing member is formed using a ceramic material so as to prevent a short circuit between the power supply pad and the ground pad, both pads are covered with the insulative reinforcing member, and it is difficult to extend an electric circuit from the pads. Additionally, since the ceramic material has a thermal conductivity smaller than that of a metal material, amounts of heat radiation from the power supply pad and the ground pad are reduced.

In consideration of the above problems, an object of the present invention is to provide a semiconductor device which can prevent a short circuit between a power supply pad and a ground pad formed at the semiconductor device while reducing a warp of a semiconductor chip, and can easily extend an electric circuit from the power supply pad and the ground pad.

Means for Solving the Problem

In order to achieve the above object, the present invention provides a semiconductor device comprising:
a wiring substrate;
a semiconductor chip fixedly attached to a first surface of the wiring substrate;
a power supply pad that is provided on a second surface opposite to the first surface of the wiring substrate, and supplies electric power to the wiring substrate;
a ground pad that is provided on the second surface of the wiring substrate and grounds the wiring substrate;
a power supply-side reinforcing member that is connected to the power supply pad and made of metal;
a ground-side reinforcing member that is connected to the ground pad and made of metal; and
an insulating part that insulates the power supply-side reinforcing member and the ground-side reinforcing member from each other.

Effect of the Invention

In accordance with the semiconductor device of the present invention, the power supply-side reinforcing member and the ground-side reinforcing member are insulated from each other by the insulating part, the power supply-side reinforcing member is connected to the power supply pad, and the ground-side reinforcing member is connected to the ground pad.

Therefore, a warp of a semiconductor chip fixed on a wiring substrate can be suppressed using the power supply-side reinforcing member and the ground-side reinforcing member while maintaining an insulated state between a power supply pad and a ground pad.

In addition, since the power supply-side reinforcing member and the ground-side reinforcing member are each made of metal, an electric circuit extending to the power supply pad and the ground pad is further extended to the power supply-side reinforcing member and the ground-side reinforcing member. Therefore, when an electronic part such as a capacitor is connected to the reinforcing members, the capacitor can be easily connected to the wiring substrate by means of the power supply-side reinforcing member or the ground-side reinforcing member.

MODE FOR CARRYING OUT THE INVENTION

First Embodiment

Below, a first embodiment of the present invention will be explained with reference to FIGS. 1 to 6. In all FIGS. 1 to 6, each thickness or dimension ratio between shown parts slightly differs from actual value for better understanding of the drawings.

Figure 1:
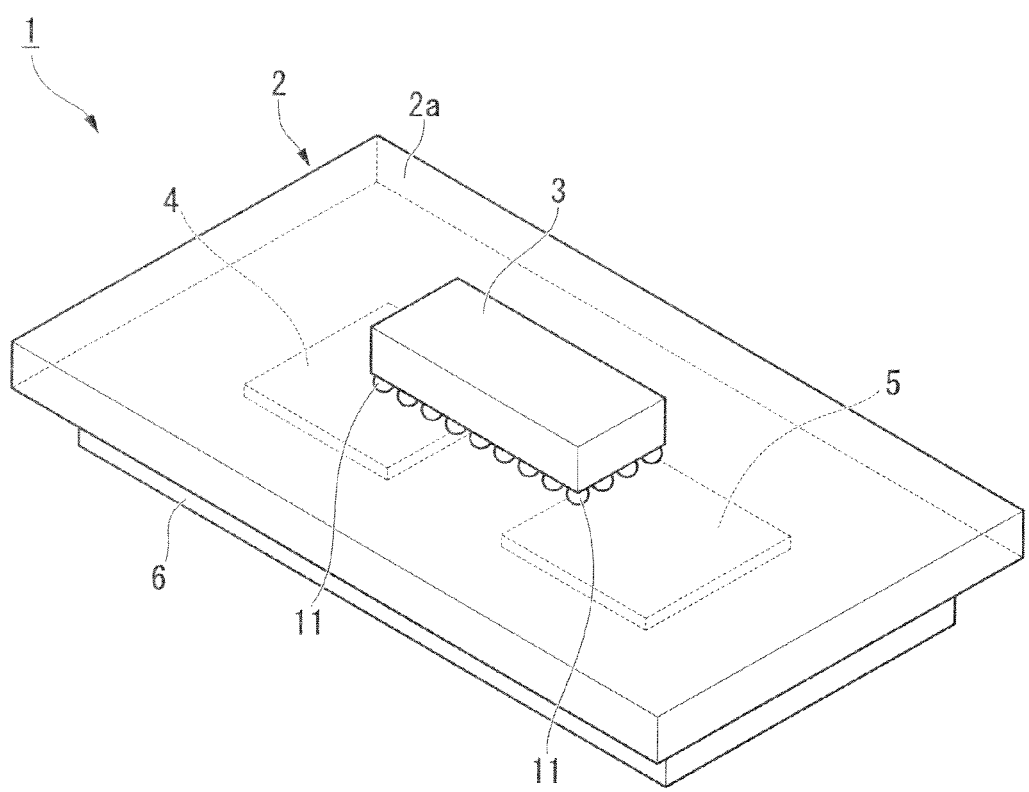
FIG. 1 is a perspective view of a semiconductor device as a first embodiment of the present invention.
Figure 2:
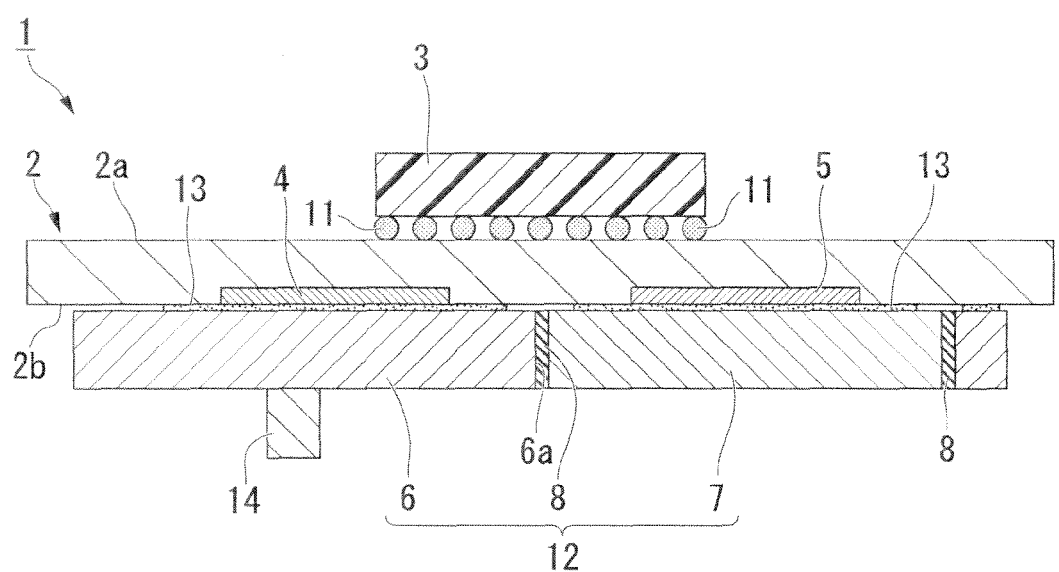
FIG. 2 is a sectional view showing distinctive parts in FIG. 1.

As shown in FIGS. 1 and 2, a semiconductor device 1 of the present embodiment has a wiring substrate 2 having a flat plate shape; an LSI 3 (semiconductor chip) fixedly formed on a main surface 2a (first surface) of the wiring substrate 2; a power supply pad 4 and a ground pad 5 provided on a back surface 2b (second surface) opposite to the main surface 2a of the wiring substrate 2; a power supply-side reinforcing member 6 and a ground-side reinforcing member 7 for reinforcing the wiring substrate 2; and an insulative adhesive 8 (insulating part or insulative member) for connecting the power supply-side reinforcing member 6 and the ground-side reinforcing member 7 with each other.

The wiring substrate 2 is formed by stacking a power supply layer, a ground layer, a signal layer, and the like (they are not shown).

The LSI 3 is generally made of silicon, and is connected to the main surface 2a of the wiring substrate 2 via solder balls 11.

Figure 3:
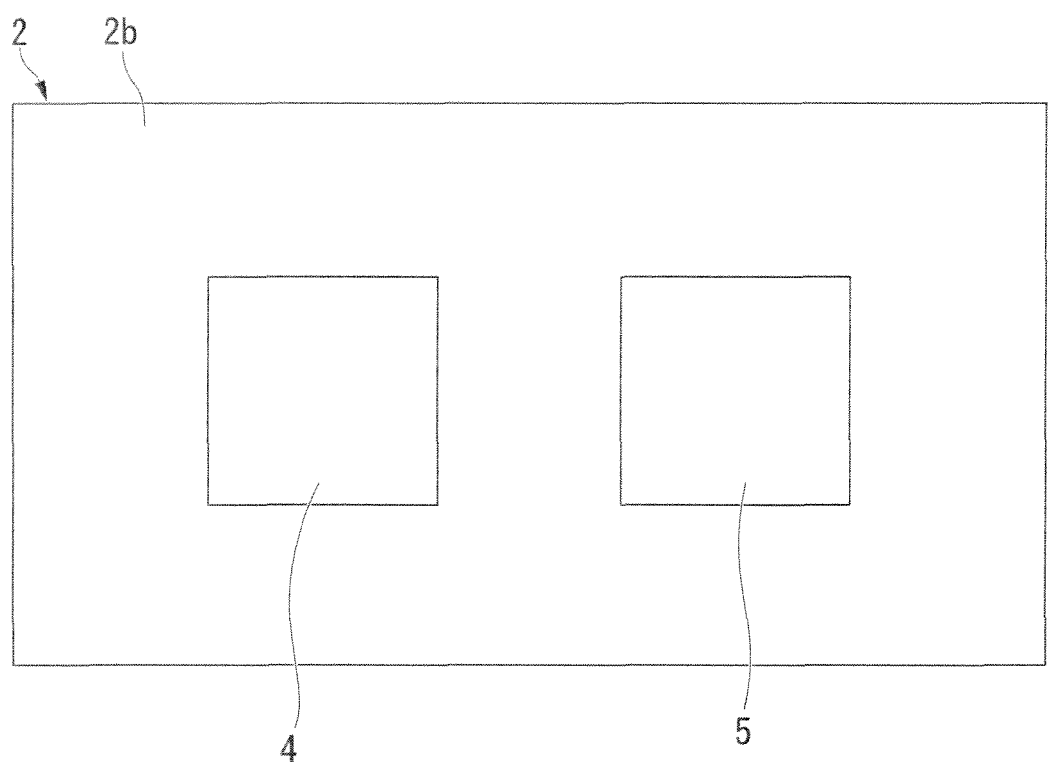
FIG. 3 is a bottom view of a wiring substrate of the semiconductor device.
Figure 4:
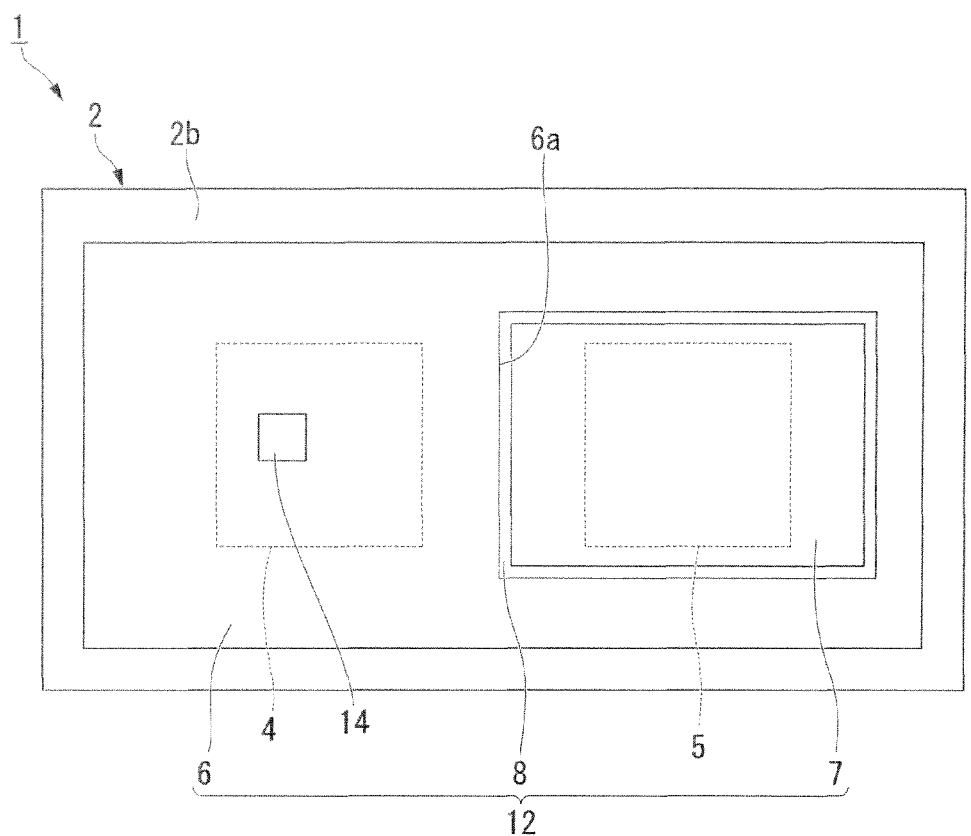
FIG. 4 is a bottom view of the semiconductor device.

As shown in FIG. 3, the power supply pad 4 and the ground pad 5, each having a substantially square shape in plan view, are provided on the back surface 2b of the wiring substrate 2.

The power supply pad 4 and the ground pad 5 are separated from each other by a predetermined distance in a manner such that one of them has a side in parallel to a side of the other. Additionally, the power supply pad 4 and the ground pad 5 are insulated from each other by means of the wiring substrate 2. The power supply pad 4 is provided for supplying power to the LSI 3 and the like via the wiring substrate 2, and the ground pad 5 is provide for grounding the wiring substrate 2.

The shape or arrangement of the power supply pad 4 and the ground pad 5 is not limited to the above. The essential condition is that a power supply pad and a ground pad are arranged on the back surface 2b of the wiring substrate 2 in a manner such that they are separated from each other by a predetermined distance, and are insulated from each other.

The power supply-side reinforcing member 6 and the ground-side reinforcing member 7 are each made of metal which may be a tungsten copper alloy. Preferably, the coefficient of linear expansion of the power supply-side reinforcing member 6 and the ground-side reinforcing member 7 is set to a value smaller than or equal to $9.0 \times 10^{-6}(1/^\circ C.)$, where this range includes $4 \times 10^{-6}(1/^\circ C.)$ that is the coefficient of linear expansion of silicon of which the LSI 3 is generally made.

In addition, silicon (for forming the LSI 3) has a modulus of longitudinal elasticity of approximately 170 Gpa, and the metal for forming the power supply-side reinforcing member 6 and the ground-side reinforcing member 7 has a modulus of longitudinal elasticity of approximately 170 Gpa or larger.

The ground-side reinforcing member 7 has a square shape in plan view.

The power supply-side reinforcing member 6 has a plate shape slightly smaller than the wiring substrate 2 in plan view. The power supply-side reinforcing member 6 has a hole part 6a having a size by which the ground-side reinforcing member 7 can be contained in the hole while securing a specific gap around the ground-side reinforcing member 7.

In the above gap, the above-described insulative adhesive 8 is provided, which is made of insulative epoxy resin or the like. The power supply-side reinforcing member 6, the ground-side reinforcing member 7, and the insulative adhesive 8 integrally form a reinforcing plate 12.

The power supply-side reinforcing member 6 and the ground-side reinforcing member 7 are respectively connected to the power supply pad 4 and the ground pad 5 via conductive joint members 13 such as solder members.

For the above connection, in order not to form a short circuit between the power supply pad 4 and the ground pad 5 via the joint members 13, the joint member 13 connected to the power supply pad 4 and the joint member 13 connected to the ground pad 5 are arranged such that they do not contact each other.

In the present embodiment, a connector 14 (connection part) for detachably connecting a terminal of a power supply (not shown) to the power supply-side reinforcing member 6 is provided at the power supply-side reinforcing member 6.

Below, a method of manufacturing the semiconductor device 1 having the above-described structure will be explained.

Figure 5:
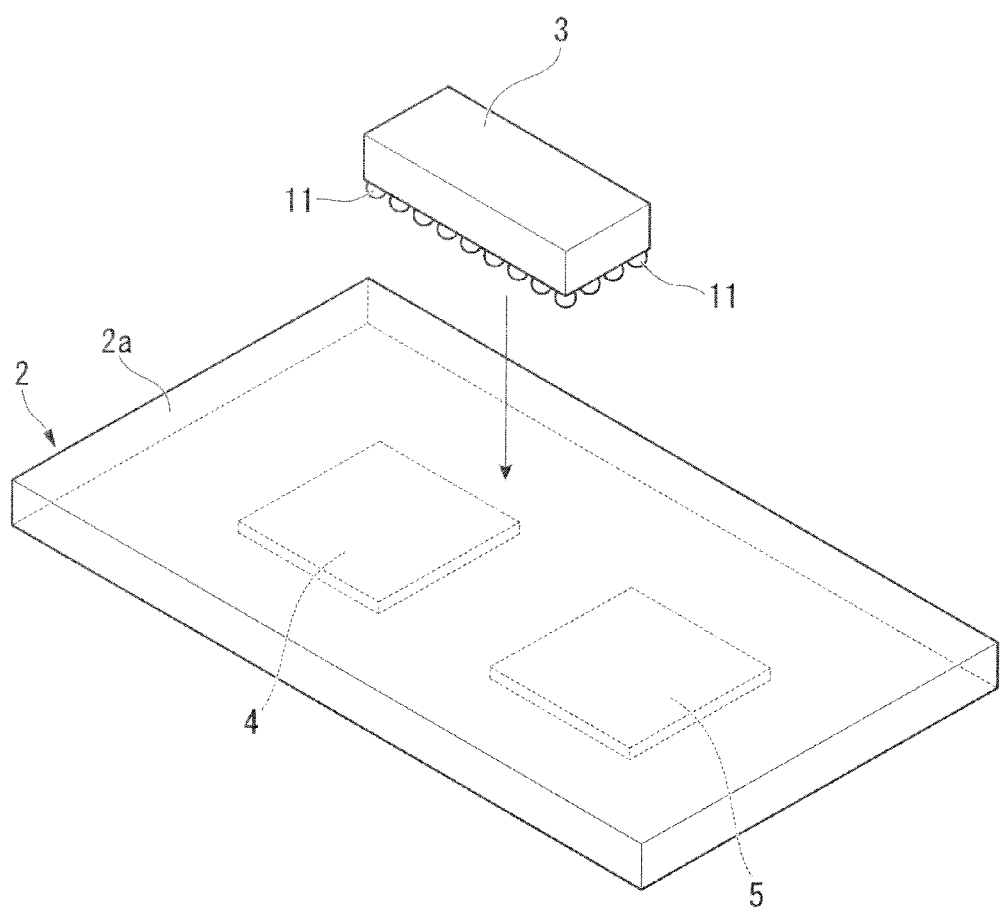
FIG. 5 is a perspective view explaining a method of assembling the semiconductor device.

First, in a reflow process as shown in FIG. 5, the LSI 3 is mounted on the main surface 2a of the wiring substrate 2 in a high temperature atmosphere by which the solder balls 11 have a temperature higher than or equal to their melting point.

In the reflow process, the wiring substrate 2, the LSI 3, and the like are heated up to, for example, 220 to 260° C.

Figure 6:
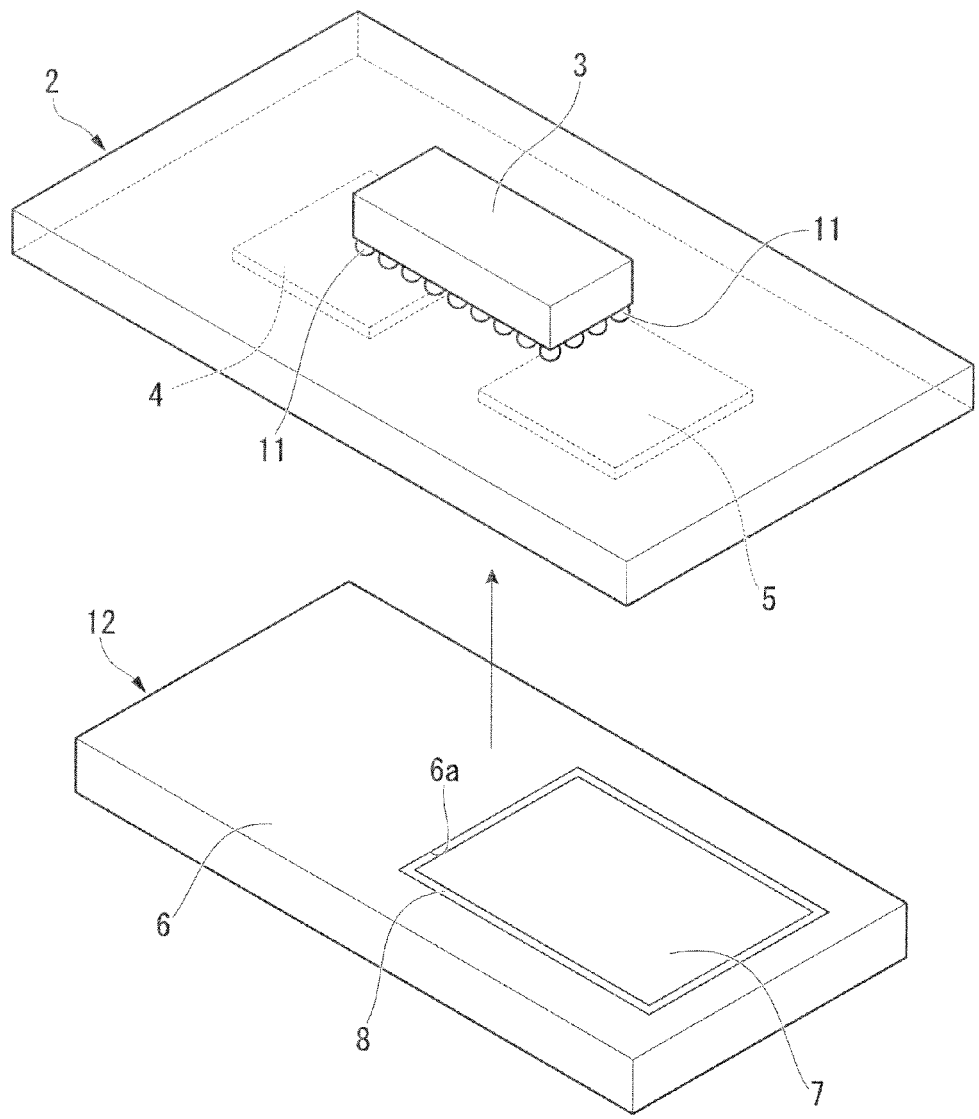
FIG. 6 is also a perspective view explaining the method of assembling the semiconductor device.

After that, as shown in FIG. 6, the ground-side reinforcing member 7 is disposed in the hole part 6a of the power supply-side reinforcing member 6, and the inner periphery surface of the hole part 6a and the outer-peripheral surface of the ground-side reinforcing member 7 are adhered to each other by using the insulative adhesive 8, thereby forming the reinforcing plate 12.

Then an atmosphere having a temperature lower than the melting point of the solder balls 11 is formed where warps of the LSI 3 and the wiring substrate 2 are removed. Under this condition, the reinforcing plate 12 is attached to the back surface 2b of the wiring substrate 2 by means of solder, thermoset adhesive, or the like.

The method of mounting the LSI 3 and the reinforcing plate 12 is not limited to the above, and the LSI 3 and the reinforcing plate 12 may be simultaneously mounted on the wiring substrate 2 in an atmosphere having a temperature higher than or equal to the melting point of the solder balls 11.

Next, the connector 14 is attached to the power supply-side reinforcing member 6 via solder or the like (not shown).

As described above, in accordance with the semiconductor device 1 of the present embodiment, the LSI 3 is fixedly disposed on the main surface 2a of the wiring substrate 2 by using the solder balls 11, and the reinforcing plate 12 is formed by adhering the power supply-side reinforcing member 6 and the ground-side member 7 via the insulative adhesive 8. The power supply-side reinforcing member 6 and the ground-side member 7 are respectively connected to the power supply pad 4 and the ground pad 5 on the back surface 2b of the wiring substrate 2 via the joint members 13.

Accordingly, it is possible to prevent the LSI 3 from warping due to a temperature difference of approximately 220° C. from the temperature of the reflow process to the ordinary temperature.

In addition, since the LSI 3 is fixed on the main surface 2a of the wiring substrate 2 and the power supply pad 4 and the ground pad 5 are provided on the back surface 2b thereof, the LSI 3, the power supply pad 4, and the ground pad 5 can be arranged on the wiring substrate 2 in a compact manner.

Furthermore, heat of the wiring substrate 2 can be effectively radiated via the power supply-side reinforcing member 6 and the ground-side reinforcing member 7 which are made of metal having a relatively thermal conductivity in comparison with other solids such as resin.

In addition, the insulative adhesive 8 is provided between the power supply-side reinforcing member 6 and the ground-side reinforcing member 7 so as to combine them. Therefore, it is possible to reliably prevent the power supply pad 4 and the ground pad 5 from forming a short circuit due to contact between the power supply-side reinforcing member 6 and the ground-side reinforcing member 7.

Furthermore, since the power supply-side reinforcing member 6 and the ground-side reinforcing member 7 can be attached with a specific strength by means of the insulative adhesive 8, the degree of a warp of the LSI 3 can be further reduced.

Additionally, since the power supply-side reinforcing member 6 and the ground-side reinforcing member 7 are made of metal having a modulus of longitudinal elasticity of approximately 170 Gpa or larger, the rigidity of the power supply-side reinforcing member 6 and the ground-side reinforcing member 7 with respect to the wiring substrate 2 can be improved, thereby further reducing the degree of a warp of the LSI 3.

In addition, the connector 14 is provided at the power supply-side reinforcing member 6. Therefore, when a terminal of a power supply is connected to the connector 14, the power supply-side reinforcing member 6 can function as a power supply-side terminal which supplies power to the LSI 3 or the wiring substrate 2.

Additionally, since the reinforcing members 6 and 7 can respectively function as a power supply terminal and a ground terminal, electronic parts such as a capacitor can be mounted between the reinforcing members 6 and 7.

Second Embodiment

Below, a second embodiment of the present invention will be explained, where parts identical to those in the above-described first embodiment are given identical reference numerals, explanations thereof are omitted, and only distinctive parts are explained.

Figure 7:
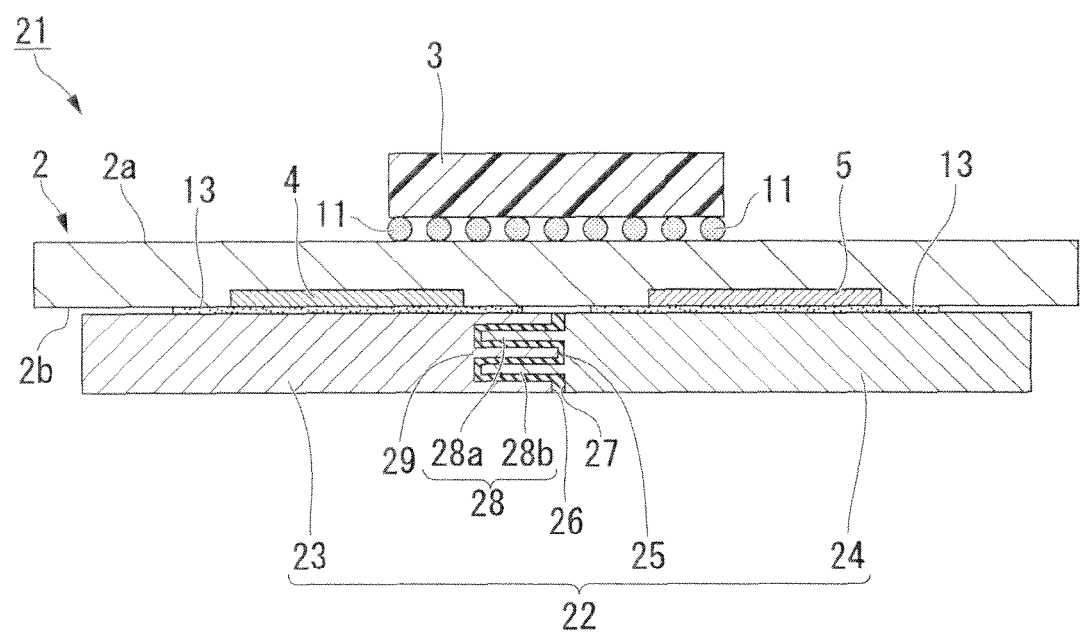
FIG. 7 is a sectional view showing distinctive parts of a semiconductor device as a second embodiment of the present invention.
Figure 8:
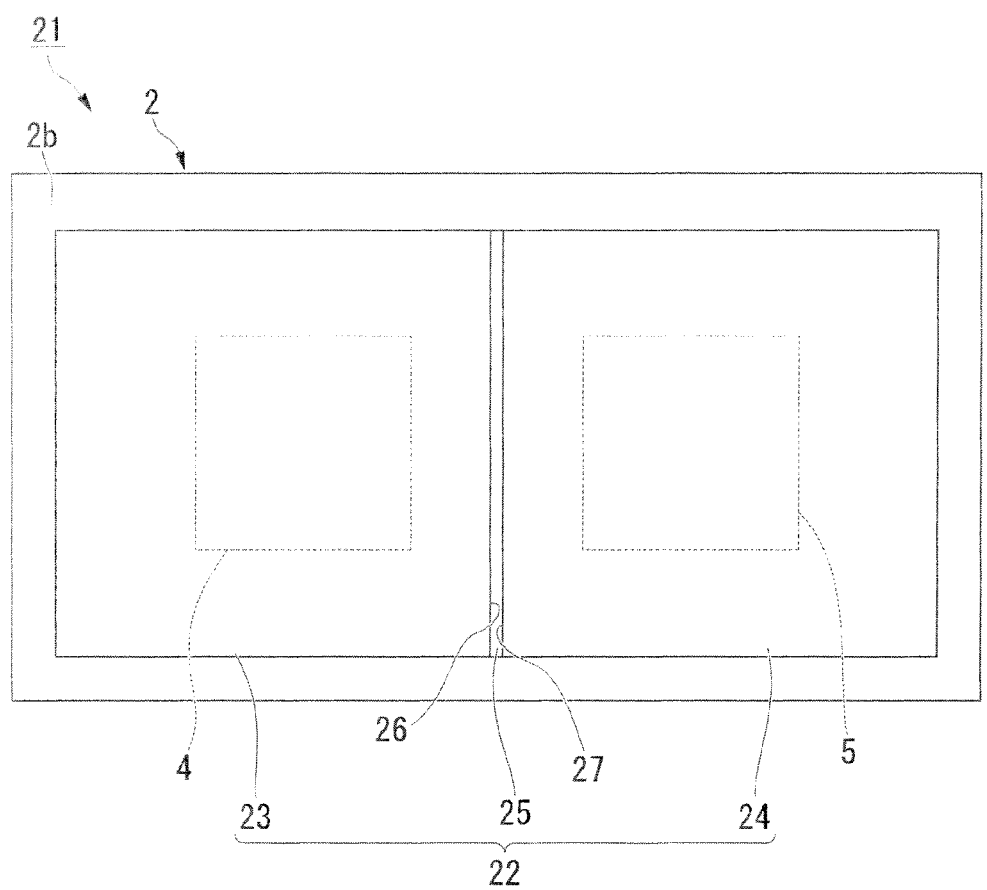
FIG. 8 is a bottom view of the semiconductor device.

As shown in FIGS. 7 and 8, a semiconductor device 21 of the present embodiment has a reinforcing plate 22 in place of the reinforcing plate 12 of the first embodiment.

The reinforcing plate 12 has a power supply-side reinforcing member 23 and a ground-side reinforcing member 24 which have plate shapes having substantially the same shape, and an insulative adhesive 25 (insulating part or insulative member) that is disposed between the reinforcing members 23 and 24 and connects them, The power supply-side reinforcing member 23 and the ground-side reinforcing member 24 respectively have a power supply-side facing surface 26 and a ground-side facing surface 27. The power supply-side reinforcing member 23 and the ground-side reinforcing member 24 are arranged in a manner such that the power supply-side facing surface 26 and the ground-side facing surface 27 face each other. The ground-side facing surface 27 has a comb shape part 28 including two protruding parts 28a and 28b which protrude toward the power supply-side facing surface 26. The power supply-side facing surface 26 has a comb shape part 29 including two recessed parts which are engaged with the two protruding parts 28a and 28b via the insulative adhesive 25.

In FIG. 7, the comb shape parts 28 and 29 are provided over the entire length of the reinforcing members 23 and 24 in the depth direction thereof (i.e., direction perpendicular to the paper plane).

In addition, the power supply-side reinforcing member 23 and the ground-side reinforcing member 24 are made of the same material as that of the above-described reinforcing members 6 and 7, and the insulative adhesive 25 is made of the same material as that of the above-described insulative adhesive 8.

Additionally, the power supply-side reinforcing member 23 and the ground-side reinforcing member 24 are respectively connected to the power supply pad 4 and the ground pad 5 via the joint members 13, which are arranged so as not to form a short circuit between the power supply pad 4 and the ground pad 5 due to the joint members 13.

Below, a method of manufacturing the semiconductor device 21 having the above-described structure will be explained.

First, in a reflow process, the LSI 3 is mounted on the main surface 2a of the wiring substrate 2 in a high temperature atmosphere by which the solder balls 11 have a temperature higher than or equal to their melting point.

After that, the reinforcing plate 22 is formed by connecting the comb shape part 29 of the power supply-side reinforcing member 23 with the comb shape part 28 of the ground-side reinforcing member 24 by means of the insulative adhesive 25.

Then an atmosphere having a temperature lower than the melting point of the solder balls 11 is formed where warps of the LSI 3 and the wiring substrate 2 are removed. Under this condition, the reinforcing plate 22 is attached to the wiring substrate 2 by means of solder, thermoset and conductive adhesive, or the like.

The method of mounting the LSI 3 and the reinforcing plate 22 is not limited to the above, and the LSI 3 and the reinforcing plate 22 may be simultaneously mounted on the wiring substrate 2 in an atmosphere having a temperature higher than or equal to the melting point of the solder balls 11.

As described above, similar to the above first embodiment, in accordance with the semiconductor device 21 of the present embodiment, a short circuit between the power supply pad 4 and the ground pad 5 provided on the wiring substrate 2 can be prevented while providing the reinforcing members 23 and 24 for suppressing a warp of the LSI 3. In addition, an electric circuit can be easily extended from the power supply pad 4 and the ground pad 5.

Additionally, since the comb shape part 28 having the two protruding parts 28a and 28b is formed at the ground-side reinforcing member 24 and the comb shape part 29 having the two recessed parts engaged with the protruding parts 28a and 28b is formed at the power supply-side reinforcing member 23, a relatively large surface area can be secured for adhering the power supply-side reinforcing member 23 and the ground-side reinforcing member 24 to each other.

Therefore, the strength for adhering the power supply-side reinforcing member 23 and the ground-side reinforcing member 24 via the insulative adhesive 25 can be improved, thereby further reliably suppressing a warp of the LSI 3.

In addition, since the comb shape parts 28 and 29 are provided, any one of the power supply-side reinforcing member 23 and the ground-side reinforcing member 24 reliably exists in the thickness direction of the reinforcing plate 22, thereby improving the strength of the reinforcing plate 22.

Although the two protruding parts 28a and 28b are provided at the comb shape part 28 of the ground-side reinforcing member 24, this is not an inevitable condition, and any number of (i.e., one or more) protruding parts may be provided. For the protruding parts, the comb shape part of the power supply-side reinforcing member 23 should have a corresponding number of recessed parts.

In another example, a protruding part is provided at the power supply-side facing surface 26 of the power supply-side reinforcing member 23, and a recessed part engaged with this protruding part is provided at the ground-side facing surface 27 of the ground-side reinforcing member 24.

Third Embodiment

Below, a third embodiment of the present invention will be explained, where parts identical to those in the above-described embodiments are given identical reference numerals, explanations thereof are omitted, and only distinctive parts are explained.

Figure 9:
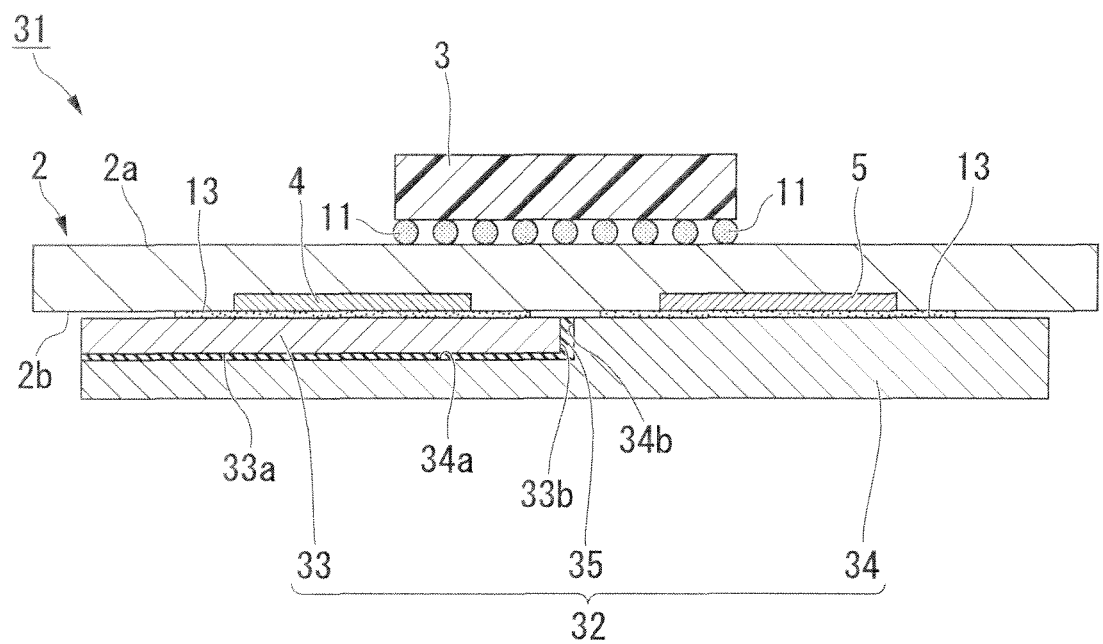
FIG. 9 is a sectional view showing distinctive parts of a semiconductor device as a third embodiment of the present invention.
Figure 10:
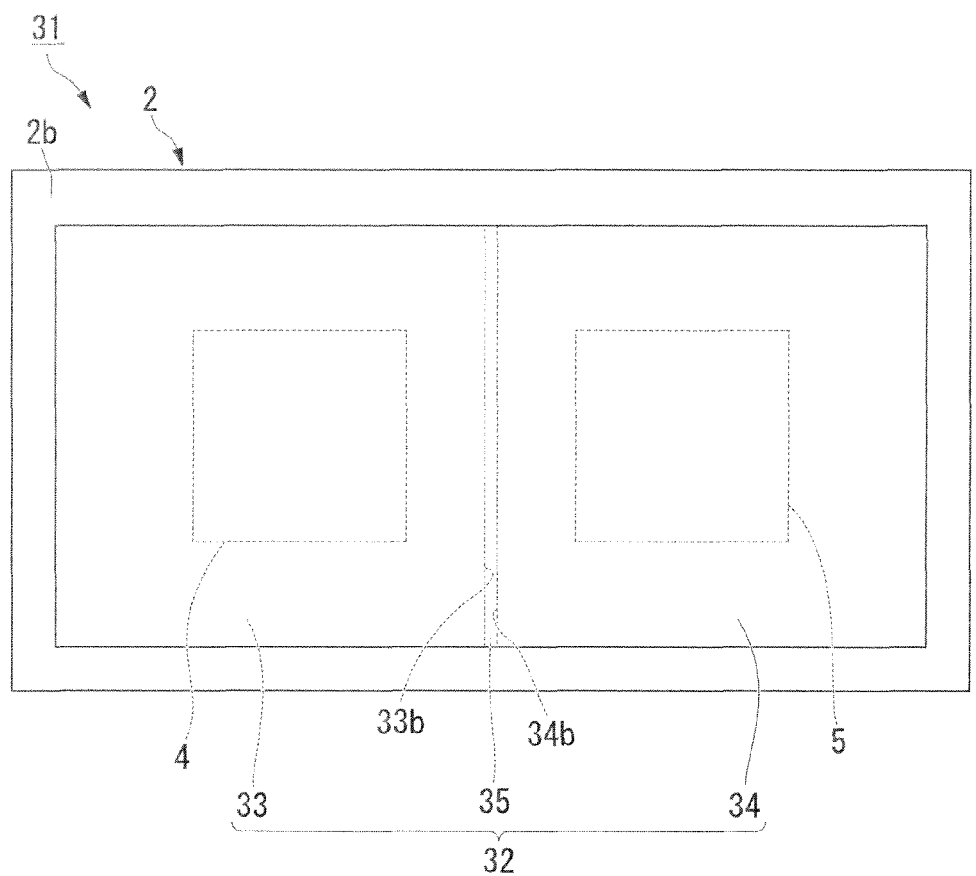
FIG. 10 is a bottom view of the semiconductor device.

As shown in FIGS. 9 and 10, a semiconductor device 31 of the present embodiment has a reinforcing plate 32 in place of the reinforcing plate 12 of the first embodiment.

The reinforcing plate 32 has a power supply-side reinforcing member 33 having a plate shape; a ground-side reinforcing member 34 having a substantially L-shape in side view so as to be engaged with the power supply-side reinforcing member 33; and an insulative adhesive 35 (insulating part or insulative member) that is disposed between the reinforcing members 33 and 34 and connects them.

The power supply-side reinforcing member 33 has a bottom surface 33a reference surface) and a side surface 33b (second reference surface), which are perpendicular to each other, and arranged such that they respectively face a surface 34a (first facing surface) and a surface 34b (second facing surface) of the ground-side reinforcing member 34. The bottom surface 33a and the side surface 33b are respectively connected to the surfaces 34a and 34b via the insulative adhesive 35.

The power supply-side reinforcing member 33 and the ground-side reinforcing member 34 are made of the same material as that of the above-described reinforcing members 6 and 7, and the insulative adhesive 35 is made of the same material as that of the above-described insulative adhesive 8.

Additionally, the power supply-side reinforcing member 33 and the ground-side reinforcing member 34 are respectively connected to the power supply pad 4 and the ground pad 5 via the joint members 13, which are arranged so as not to form a short circuit between the power supply pad 4 and the ground pad 5 due to the joint members 13.

Below, a method of manufacturing the semiconductor device 31 having the above-described structure will be explained.

First, in a reflow process, the LSI 3 is mounted on the main surface 2a of the wiring substrate 2 in a high temperature atmosphere by which the solder balls 11 have a temperature higher than or equal to their melting point.

After that, the reinforcing plate 32 is formed by respectively connecting the bottom surface 33a and the side surface 33b of the power supply-side reinforcing member 33 to the surfaces 34a and 34b of the ground-side reinforcing member 34 by means of the insulative adhesive 35.

Then an atmosphere having a temperature lower than the melting point of the solder balls 11 is formed where warps of the LSI 3 and the wiring substrate 2 are removed. Under this condition, the reinforcing plate 32 is attached to the wiring substrate 2 by means of solder, thermoset adhesive, or the like.

The method of mounting the LSI 3 and the reinforcing plate 32 is not limited to the above, and the LSI 3 and the reinforcing plate 32 may be simultaneously mounted on the wiring substrate 2 in an atmosphere having a temperature higher than or equal to the melting point of the solder balls 11.

As described above, similar to the above first embodiment, in accordance with the semiconductor device 31 of the present embodiment, a short circuit between the power supply pad 4 and the ground pad 5 provided on the wiring substrate 2 can be prevented while suppressing a warp of the LSI 3. In addition, an electric circuit can be easily extended from the power supply pad 4 and the ground pad 5.

Additionally, since the power supply-side reinforcing member 33 and the ground-side reinforcing member 34 are connected in two directions perpendicular to each other, thereby increasing the surface area for the adhesion between the power supply-side reinforcing member 33 and the ground-side reinforcing member 34. Therefore, the strength for adhering the power supply-side reinforcing member 33 and the ground-side reinforcing member 34 via the insulative adhesive 35 can be improved, thereby further reliably suppressing a warp of the LSI 3.

In addition, only the ground-side reinforcing member 34 is exist in a lower part of the reinforcing plate 32. Such a structure can be preferably employed when a larger number of parts are connected to the ground side in comparison with the power supply side.

In a variation of the present embodiment, the ground-side reinforcing member has a plate shape, and the power supply-side reinforcing member has a substantially L-shape in side view so as to be engaged with the ground-side reinforcing member.

Fourth Embodiment

Below, a fourth embodiment of the present invention will be explained, where parts identical to those in the above-described embodiments are given identical reference numerals, explanations thereof are omitted, and only distinctive parts are explained.

Figure 11:
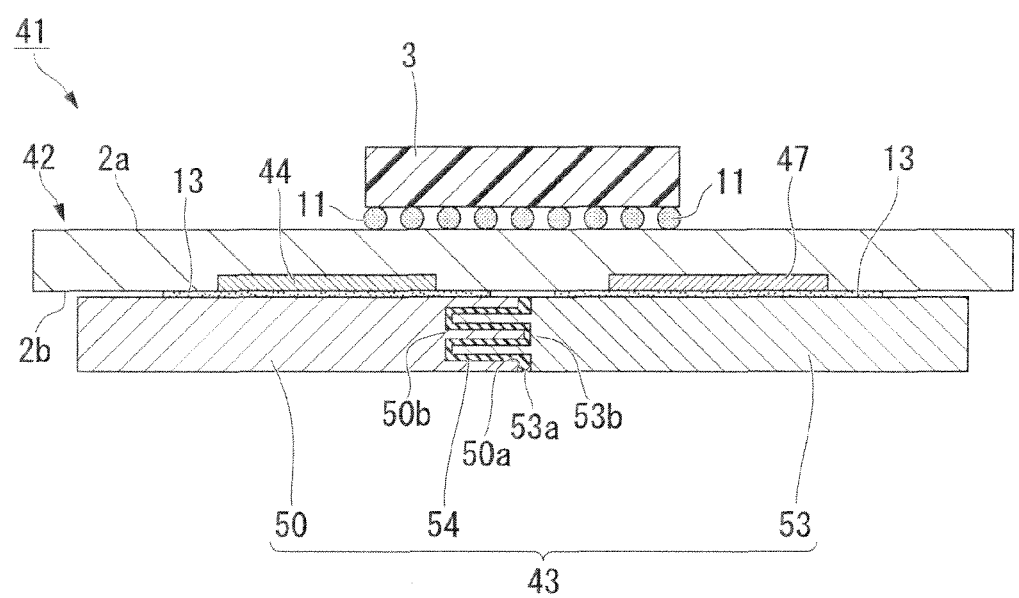
FIG. 11 is a sectional view showing distinctive parts of a semiconductor device as a fourth embodiment of the present invention.
Figure 12:
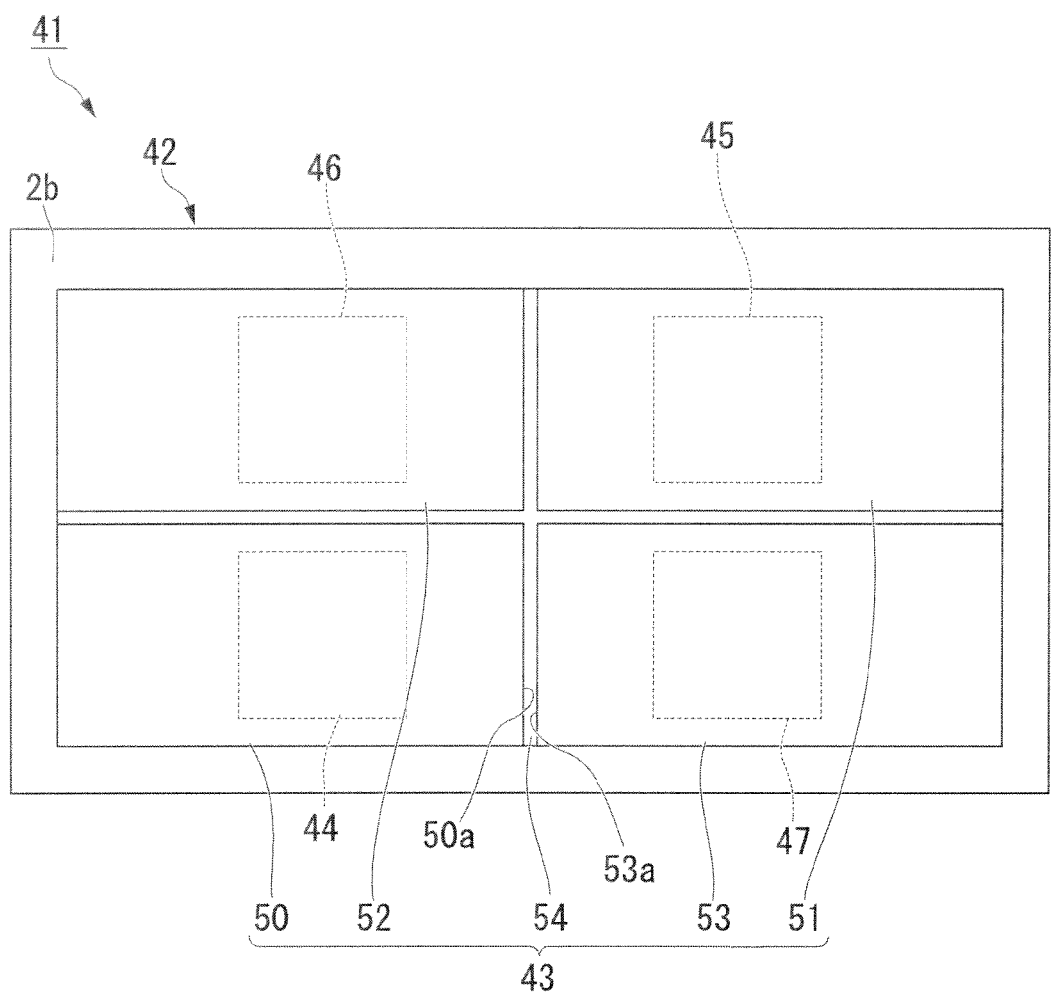
FIG. 12 is a bottom view of the semiconductor device.

As shown in FIGS. 11 and 12, a semiconductor device 41 of the present embodiment has a wiring substrate 42 and a reinforcing plate 43 in place of the wiring substrate 2 and the reinforcing plate 12 of the first embodiment.

Figure 13:
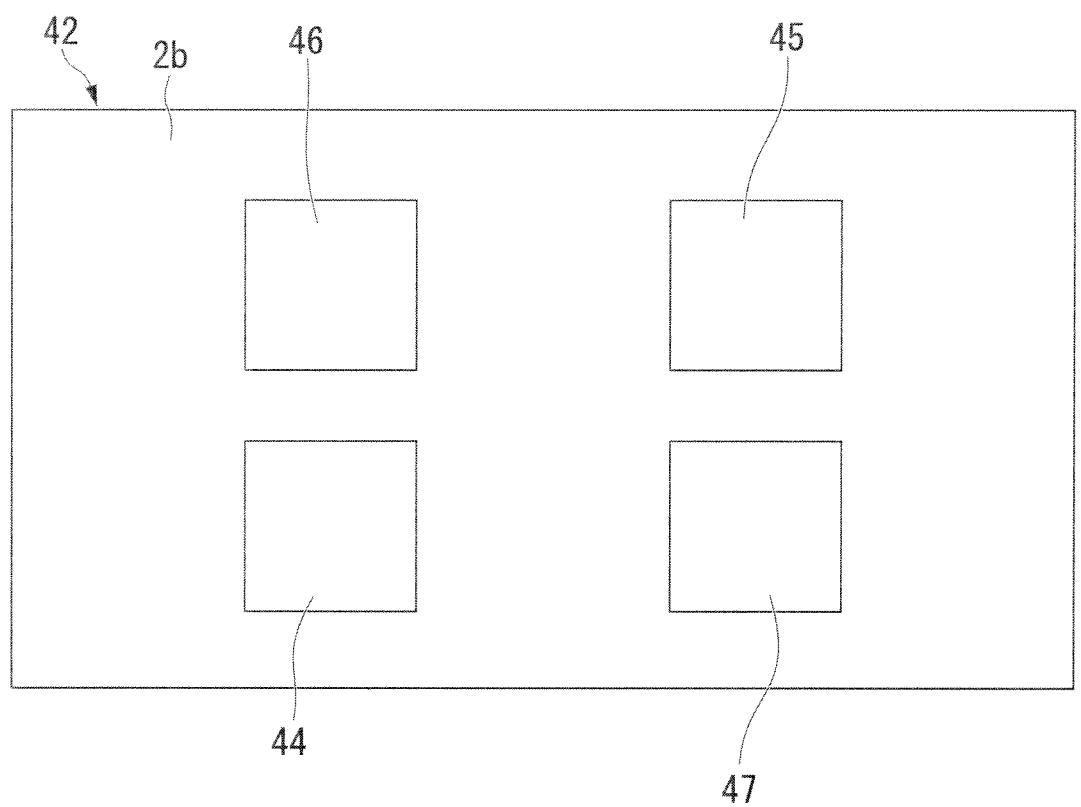
FIG. 13 is a bottom view of a wiring substrate of the semiconductor device.

As shown in FIG. 13, the wiring substrate 42 has a flat plate shape, and on a back surface 2b thereof, two power supply pads 44 and 45 and two ground pads 46 and 47, each having a square shape in plan view, are provided.

The power supply pads 44 and 45 and the ground pads 46 and 47 are separated from each other by a specific distance so as to make a lattice form, where corresponding sides of them are in parallel to each other. Additionally, the power supply pads 44 and 45 are arranged on a diagonal line of the lattice, and the ground pads 46 and 47 are also arranged on a diagonal line thereof.

The number, shape, and arrangement of the not limited to the above. The essential condition is that each power supply pad and each ground pad are arranged on the back surface 2b of the wiring substrate 42 in a manner such that they are separated from each other by a specific distance, and are insulated from each other.

As shown in FIGS. 11 and 12, the reinforcing plate 43 has two power supply-side reinforcing members 50 and 51 and two ground-side reinforcing members 52 and 53, each having substantially the same plate shape; and an insulative adhesive 54 which is provided at each position interposed by the reinforcing members 50 to 53 so as to connect them.

The reinforcing members 50 to 53 are separated from each other by a specific distance so as to make a lattice form, where corresponding sides of them are parallel to each other. Additionally, the power supply-side reinforcing members 50 and 51 are arranged on a diagonal line of the lattice, and the ground-side reinforcing members 52 and 53 are also arranged on a diagonal line thereof.

Similar to the second embodiment, the power supply-side reinforcing member 50 and the and the ground-side reinforcing member 53 respectively have a power supply-side facing surface 50a and a ground-side facing surface 53a. The power supply-side reinforcing member 50 and the ground-side reinforcing member 53 are arranged in a manner such that the power supply-side facing surface 50a and the ground-side facing surface 53a face each other.

Also similar to the second embodiment, the power supply-side facing surface 50a and the ground-side facing surface 53a respectively have comb shape parts 50b and 53b which are engaged with each other.

Similar comb shape parts (not shown) are also formed between each of the adjacent power supply-side reinforcing member 50 and ground-side reinforcing member 52, the adjacent power supply-side reinforcing member 51 and ground-side reinforcing member 52, and the adjacent power supply-side reinforcing member 51 and ground-side reinforcing member 53.

A specific gap is formed between the engaged comb shape parts of each combination, and insulative adhesive 54 is provided in the gap. The reinforcing members 50 to 53 are connected to each other via the insulative adhesive 54, as described above.

The power supply-side reinforcing members 50 and 51 and the ground-side reinforcing members 52 and 53 are made of the same material as that of the above-described reinforcing members 6 and 7, and the insulative adhesive 54 is made of the same material as that of the above-described insulative adhesive 8.

The power supply-side reinforcing members 50 and 51 and the ground-side reinforcing members 52 and 53 are respectively connected to the power supply pads 44 and 45 and the ground pads 46 and 47 via the joint members 13.

In this process, the joint members 13 are arranged so as not to form a short circuit between the power supply-side reinforcing members 50 and 51 and the ground-side reinforcing members 52 and 53 due to the joint members 13.

Below, a method of manufacturing the semiconductor device 41 having the above-described structure will be explained.

First, in a reflow process, the LSI 3 is mounted on the main surface 2a of the wiring substrate 42 in a high temperature atmosphere by which the solder balls 11 have a temperature higher than or equal to their melting point.

After that, the reinforcing plate 43 is formed by connecting the power supply-side reinforcing members 50 and 51 and the ground-side reinforcing members 52 and 53 with each other by means of the insulative adhesive 54.

Then an atmosphere having a temperature lower than the melting point of the solder balls 11 is formed where warps of the LSI 3 and the wiring substrate 42 are removed. Under this condition, the reinforcing plate 43 is attached to the wiring substrate 42 by means of solder, thermoset adhesive, or the like.

The method of mounting the LSI 3 and the reinforcing plate 43 is not limited to the above, and the LSI 3 and the reinforcing plate 43 may be simultaneously mounted on the wiring substrate 42 in an atmosphere having a temperature higher than or equal to the melting point of the solder balls 11.

As described above, in accordance with the semiconductor device 41 of the present embodiment, a short circuit between the power supply pads 44 and 45 and the ground pads 46 and 47 provided on the wiring substrate 42 can be prevented while suppressing a warp of the LSI 3.

In addition, even when a relatively large number of power supply pads and ground pads are provided on a wiring substrate, the semiconductor device 41 can have reinforcing members in a compact manner.

For each pair of the power supply-side reinforcing member and the ground-side reinforcing member in the present invention, one of them may have a plate shape and the other may have an L-shape in side view, and they may be connected via an insulative adhesive, as shown in the above embodiments.

Although the first to fourth embodiments of the present invention have been explained in detail with reference to the drawings, specific structures are not limited to the embodiments, and any structural variation can be made without departing from the scope of the present invention.

For example, in the above first to fourth embodiments, a power supply-side reinforcing member and a ground-side reinforcing member are connected to each other via an insulative adhesive. However, they may be insulated from each other by providing a layer of air therebetween.

INDUSTRIAL APPLICABILITY

In accordance with the semiconductor device of the present invention, a warp of a semiconductor chip fixed on a wiring substrate can be suppressed using a power supply-side reinforcing member and a ground-side reinforcing member while maintaining an insulated state between a power supply pad and a ground pad. In addition, when an electric circuit extending to the power supply pad and the ground pad is further extended to the power supply-side reinforcing member and the ground-side reinforcing member which are made of metal, and an electronic part such as a capacitor is connected to the reinforcing members, the capacitor can be easily connected to the wiring substrate by means of the power supply-side reinforcing member or the ground-side reinforcing member.

REFERENCE SYMBOLS

1, 21, 31, 41 semiconductor device
2, 42 wiring substrate
2a main surface (first surface)
2b back surface (second surface)
4, 44, 45 power supply pad
5, 46, 47 ground pad
6, 23, 33, 50, 51 power supply-side reinforcing member
7, 24, 34, 52, 53 ground-side reinforcing member
8, 25, 35, 54 insulative adhesive (insulating part or insulative member)
14 connector (connection part)
26, 50a power supply-side facing surface
27, 53a ground-side facing surface
28, 29, 50b, 53b comb shape part
28a, 28b protruding part
33a bottom surface (first facing surface)
33b side surface (second reference surface)

The invention claimed is:

1. A semiconductor device comprising:
   a wiring substrate;
   a semiconductor chip fixedly attached to a first surface of the wiring substrate;
   a power supply pad that is provided on a second surface opposite to the first surface of the wiring substrate, and supplies electric power to the wiring substrate;
   a ground pad that is provided on the second surface of the wiring substrate and grounds the wiring substrate;
   a power supply-side reinforcing member that is connected to the power supply pad and made of metal;
   a ground-side reinforcing member that is connected to the ground pad and made of metal; and
   an insulating part that insulates the power supply-side reinforcing member and the ground-side reinforcing member from each other, wherein
   the power supply-side reinforcing member and the ground-side reinforcing member respectively have a power supply-side facing surface and a ground-side facing surface which face each other;
   a protruding part is provided at one of the power supply-side facing surface and the ground-side facing surface, and protrudes toward the other facing surface; and
   a recessed part engaged with the protruding part via the insulating part is provided at the other facing surface.

2. The semiconductor device in accordance with claim 1, wherein:
   a comb shape part having a plurality of the protruding parts is provided at the protruding part.

3. The semiconductor device in accordance with claim 1, wherein:
   a first reference surface and a second reference surface perpendicular to each other are provided at one of the power supply-side reinforcing member and the ground-side reinforcing member;
   a first facing surface and a second facing surface, which respectively face the first reference surface and the second reference surface, are provided at the other of the power supply-side reinforcing member and the ground-side reinforcing member; and
   the first reference surface and the second reference surface are respectively connected to the first facing surface and the second facing surface via the insulating part.

4. The semiconductor device in accordance with claim 3, wherein:
   the power supply-side reinforcing member has a plate shape, and has two adjacent surfaces which function as the first reference surface and the second reference surface; and
   the first facing surface and the second facing surface are provided at the ground-side reinforcing member.

5. The semiconductor device in accordance with claim 1, wherein:
   the insulating part comprises an insulative member which is provided between the power supply-side reinforcing member and the ground-side reinforcing member and connects them with each other.

6. The semiconductor device in accordance with claim 1, wherein:
   the power supply-side reinforcing member and the ground-side reinforcing member each have a modulus of longitudinal elasticity of approximately 170 Gpa or larger.

7. The semiconductor device in accordance with claim 1, wherein:
   a connection part that detachably connects a terminal of a power supply to the power supply-side reinforcing member is provided at the power supply-side reinforcing member.

\* \* \* \* \*